United States Patent
Amano

(10) Patent No.: US 8,365,371 B2
(45) Date of Patent: Feb. 5, 2013

(54) METHODS FOR MANUFACTURING PIEZOELECTRIC VIBRATING DEVICES

(75) Inventor: Yoshiaki Amano, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 1083 days.

(21) Appl. No.: 12/203,035

(22) Filed: Sep. 2, 2008

(65) Prior Publication Data

US 2009/0077781 A1 Mar. 26, 2009

(30) Foreign Application Priority Data

Sep. 25, 2007 (JP) ................. 2007-247385

(51) Int. Cl.
*H04R 17/10* (2006.01)
*C03C 25/70* (2006.01)

(52) U.S. Cl. ...... 29/25.35; 29/842; 29/847; 29/DIG. 16; 216/41; 216/44; 310/311; 310/365; 310/370

(58) Field of Classification Search ............ 29/25.35, 29/842, 846, 852, 847, DIG. 16; 216/41, 216/57, 42, 44; 310/311, 365, 366, 370
See application file for complete search history.

(56) References Cited

U.S. PATENT DOCUMENTS

| 6,719,914 B2* | 4/2004 | Nakatani et al. ............ 216/57 X |
| 2003/0071542 A1 | 4/2003 | Satoh et al. |
| 2005/0116586 A1 | 6/2005 | Tanaya et al. |

FOREIGN PATENT DOCUMENTS

| EP | 1650866 A | 4/2006 |
| JP | 57080817 A * | 5/1982 |
| JP | 2001-077647 | 3/2001 |
| JP | 2002-076806 | 3/2002 |
| JP | 2003-152499 | 5/2003 |
| JP | 2004-040399 | 2/2004 |
| JP | 2004173218 A | 6/2004 |
| JP | 2004-260718 | 9/2004 |
| JP | 2004260718 A | 9/2004 |
| JP | 2005-136499 | 5/2005 |
| JP | 2007-013383 | 1/2007 |
| JP | 2007013383 A | 1/2007 |
| JP | 2008205657 A | 9/2008 |

OTHER PUBLICATIONS

Machine Language Translation of Japanese Patent Publication, JP 2001-77647 (dated Mar. 2001).*
Extended European Search Report for corresponding European Application No. 08165176.2-222, European Patent Office, Jun. 2, 2009, 7 pages.
Office Action for related Japanese Patent Application No. 2007-247385, 3 pages, dated Aug. 10, 2012.

* cited by examiner

*Primary Examiner* — A. Dexter Tugbang
(74) *Attorney, Agent, or Firm* — Klarquist Sparkman, LLP

(57) ABSTRACT

Methods are disclosed for manufacturing tuning-fork type piezoelectric vibrating devices. In an exemplary method a metal film is formed on both surfaces of a piezoelectric wafer, followed by application of photoresist. A first metal-film-etching step etches the metal film after removal of the photoresist layer outside the profile outline of the devices. A first piezoelectric-etching step etches the wafer surface but not through to the rear surface; thus, outside the profile outline the metal film is removed. A second metal-film-etching step etches the metal film after removal of the photoresist layer from first groove regions. A second piezoelectric-etching step etches outside the profile outline and the groove regions through to the rear surface.

11 Claims, 9 Drawing Sheets

B-B cross section

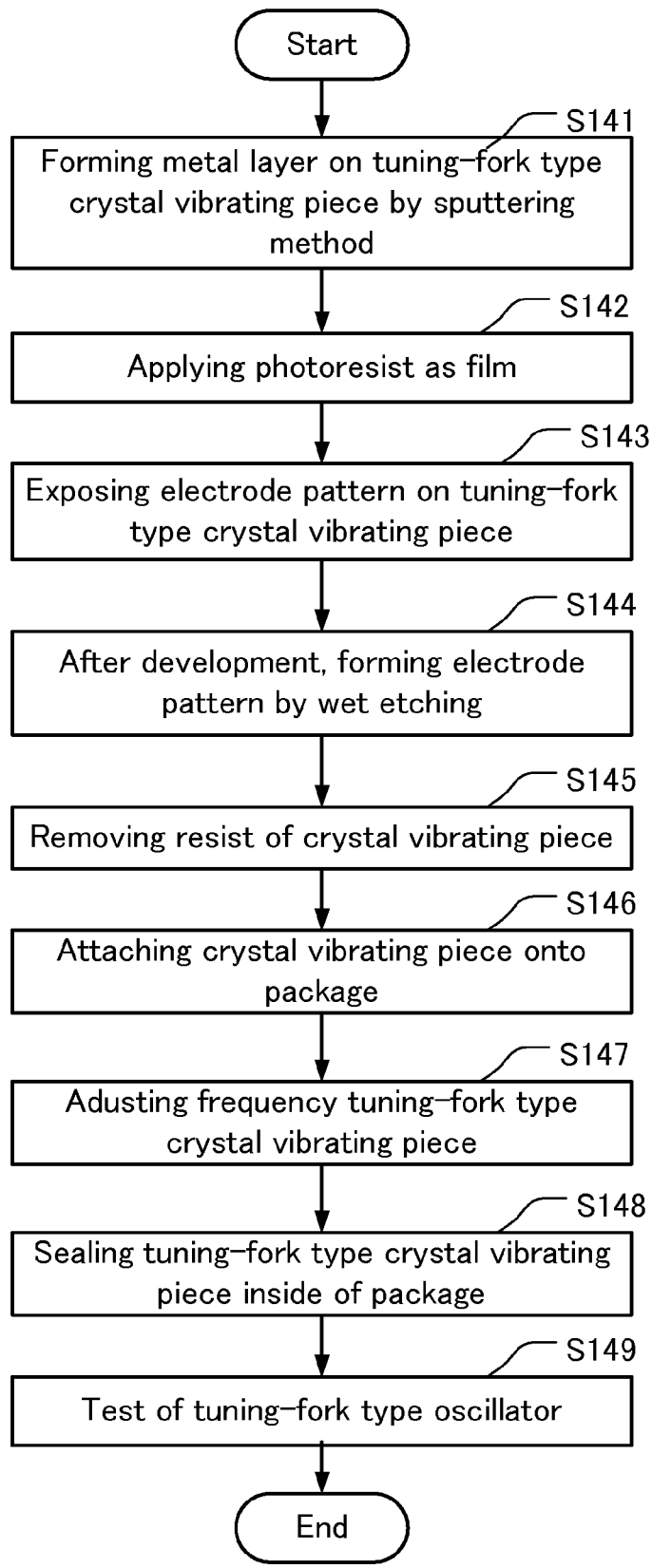

FIG. 9
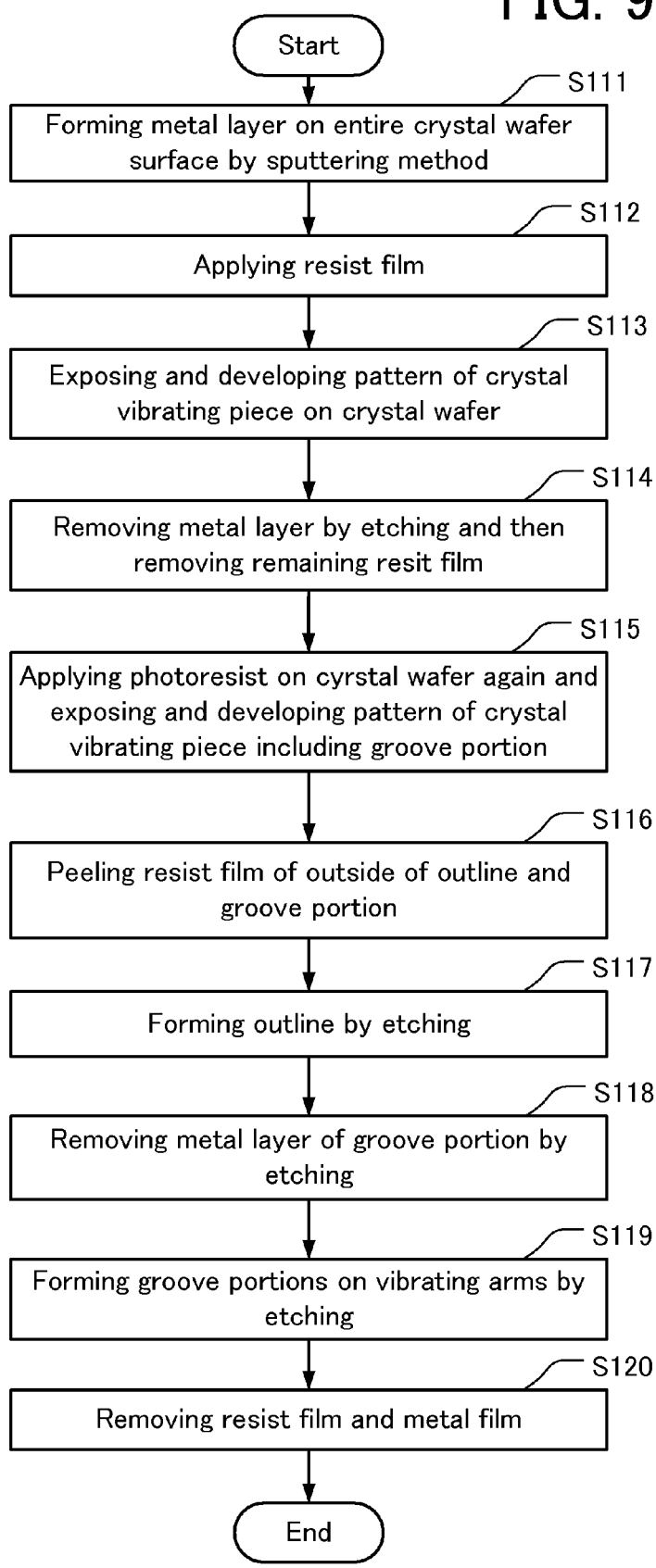
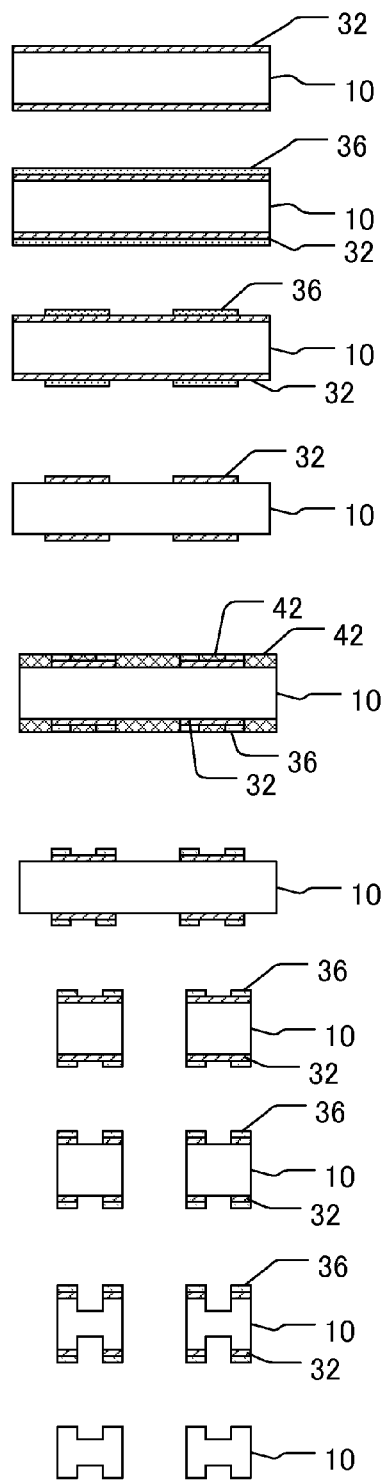

METHODS FOR MANUFACTURING PIEZOELECTRIC VIBRATING DEVICES

CROSS-REFERENCE TO RELATED APPLICATION

This application claims priority to, and the benefit of, Japan Patent Application No. 2007-247385, filed on Sep. 25, 2007, in the Japan Patent Office, the disclosure of which is incorporated herein by reference in its entirety.

FIELD

This disclosure relates to, inter alia, piezoelectric vibrating devices, particularly devices having a "tuning fork" configuration, and to methods for manufacturing such devices. The subject methods produce piezoelectric vibrating devices from piezoelectric wafer material such as crystal.

DESCRIPTION OF RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC tip as a clock source for addition to and use by an electronic circuit of the apparatus. In other apparatus, piezoelectric timing devices such as real-time clock modules are widely used. Other uses for piezoelectric vibrating devices include in apparatus for navigation-control or attitude-control of ships, aircraft, and automobiles; angular-velocity sensors in image-stabilizers and other detectors used in video cameras and the like. Also, piezoelectric vibrating gyros are widely used in various devices including rotation-direction sensors used in, e.g., three-dimensional mouse devices.

Especially nowadays, such piezoelectric vibrating devices must be increasingly miniaturized and/or provided with a thinner or lower profile to be accommodated in electronic devices and packaging schemes that are correspondingly miniaturized and/or provided with a lower profile. Also, modern piezoelectric devices must be able to provide a low CI (crystal impedance) value, high quality, and stability.

To produce a vibrating device having a low CI value, for example, tuning-fork type piezoelectric vibrating devices have been developed having vibrating arms each with a grooved region to increase the efficiency of vibration. An example of such a device is shown in FIGS. 1A and 1B. The depicted device comprises a pair of vibrating arms 21 that extend from a base portion 29. Each arm 21 has respective grooved regions 27. The grooved regions 27, other portions of the arms, and the base portion 29 also include driving ("exciting") electrodes 23, 25 for exciting the tuning fork to vibrate.

Manufacture of the vibrating device summarized above is disclosed in Japan Unexamined Patent Application No. 2002-76806. FIG. 9 is a flow-chart outlining steps for forming this vibrating device, including the grooved regions 27. Note that the figures provided along the right side of FIG. 9 are elevational sections of the results of the respective steps in the flow-chart. The sections are along the line A-A of the device 10 shown in FIG. 1A.

In step S111 of FIG. 9, metal layers 32 are formed, as shown in the figure on the right, on both sides of a cleaned and polished single-crystal wafer 10 by sputtering or other suitable technique. The metal layers 32 are a gold (Au) layer on a chrome (Cr) layer.

In step S112 a layer of photoresist is applied to each metal layer by, for example, spraying or spin-coating. (See figure to the right of step S112). In the photoresist a pattern of a crystal vibrating device (having a profile outline of a tuning-fork) is exposed and developed, and exposed portions of the resist are removed to form a tuning-fork pattern in the resist film (see figure to the right of step S113). In step S114 portions of the metal layer 32 revealed by removal of exposed resist are etched. Then, the remaining resist on the single-crystal wafer 10 is stripped (see figure to the right of step S114).

In step S115 a new layer of photoresist is applied, by spraying, to the entire surface of the single-crystal wafer 10. In the resist a pattern of the crystal vibrating device, including the groove regions 27 on the vibrating arms 21, is exposed and developed, and exposed portions of the resist are removed. See figure to the right of step S115.

In step S116 the resist outside the profile outline (having a tuning-fork shape) and in the groove regions 27 is removed. See figure to the right of step S116.

In step S117, as shown in the figure to the right of step S117, in order to make the single-crystal wafer 10 into a device having the shape of a tuning-fork type piezoelectric vibrating device, the wafer is wet-etched, using fluorinated acid, to form the desired profile outline of the device.

In step S118 the metal film 32 in the groove regions 27 is removed by wet-etching. See figure to the right of step S118.

In step S119, as shown in the figure to the right of step S119, the groove regions 27 are formed by wet-etching corresponding regions of the wafer, using fluorinated acid. Thus, the grooves are formed in the arms.

In step S120, remaining resist and metal film 32 are removed to yield a tuning-fork type piezoelectric vibrating device with grooved arms. See figure to the right of step S120.

The profile outline of this tuning-fork type piezoelectric vibrating device is etched in step S117, and etching to form the groove regions 27 is performed in step S119; hence, these steps are performed separately. Etching the profile outline takes time. Also, differences in flow and concentration of the etching solution exist in regions extending through the single-crystal wafer and in the grooves 27. These differences produce undesired differences in the sizes of the large number (hundreds to thousands) of vibrating devices formed on a single wafer. These size differences affect the frequency characteristics or electrical characteristics of the various devices produced on a single wafer, so the yield rate is decreased from optimal for the wafer.

Furthermore, forming the profile outlines of the devices is a separate step from forming the groove regions 27. Forming the profile outlines includes forming certain apertures extending through the thickness of the wafer. These apertures weaken the attachments of individual piezoelectric tuning-fork type vibrating devices to the wafer, but these attachments must be maintained during subsequent process steps. Subjecting the wafer, after forming the profile outlines to a separate etching step to form the grooves 27 increases the likelihood that individual vibrating devices still attached to the wafer will be damaged by handling, motion, or impact.

Methods as disclosed herein allow the groove regions of the arms and the profile outlines of the devices to be formed in a single step. Thus, etching time in the process is reduced, the quality of the tuning-fork type piezoelectric vibrating devices produced on a single wafer is improved, and the individual devices on the wafer are less likely to detach from the wafer or become damaged before the fabrication process is completed.

SUMMARY

This disclosure sets forth various aspects of the invention, of which a first aspect is directed to methods for manufacturing a piezoelectric vibrating device having a base and at least a pair of vibrating arms extending from the base. First groove regions are defined in the surfaces of the arms. A first embodiment of the method begins with forming a metal film on both surfaces of a piezoelectric wafer. A first layer of a photoresist is formed on the metal film, exposed, and developed to pattern the photoresist, wherein the pattern includes the profile outline of the piezoelectric vibrating device. A first metal-film-etching step is performed to etch the metal film outside the profile outline but not completely through the thickness of the wafer. A second layer of photoresist is formed on the wafer and exposed to pattern the photoresist layer, the pattern including the profile outline and the first groove regions to be formed in the vibrating arms. A second metal-film-etching step is performed to etch the metal film according to the pattern in the second layer of photoresist. A second piezoelectric-etching step is performed to etch the wafer outside the profile outline and in the first groove regions. The etching outside the profile outline is completely through the remaining thickness of the wafer, and the etching in the first groove regions is partly through the thickness, thereby forming the piezoelectric vibrating device.

Thus, the first piezoelectric-etching step etches outside the profile outline into the thickness of the wafer, but not completely through the thickness, and the second piezoelectric-etching step etches outside the profile outline the remaining distance through the thickness of the wafer while also etching the first groove regions partly through the thickness of the wafer. As a result, uniformly-sized tuning-fork type piezoelectric vibrating devices are produced using fewer manufacturing steps than conventional methods and while avoiding having to "peel" the piezoelectric vibrating devices from the crystal wafer.

A second embodiment of the method is directed to manufacturing piezoelectric vibrating devices including a base and at least a pair of vibrating arms extending from the base. The vibrating arms define first groove regions. First, a metal film is formed on both surfaces of a piezoelectric wafer. On the metal film a first layer of photoresist is formed, and the photoresist is exposed to pattern it with a pattern including the profile outline of the piezoelectric vibrating device. A first metal-film-etching step is performed to etch the metal film according to the pattern in the first layer of photoresist, including outside the profile outline. A second layer of photoresist is formed on the wafer surface and exposed to pattern the second layer of photoresist outside the profile outline and also to pattern the photoresist with the first groove regions. A second metal-film-etching step is performed to etch the metal film according to the pattern in the second layer of photoresist, including outside the profile outline and the first groove regions. A second piezoelectric-etching step is then performed to etch the wafer outside the profile outline, wherein etching outside the profile outline is completely through remaining thickness of the wafer while etching in the first groove regions is not. As a result, uniformly-sized tuning-fork type piezoelectric vibrating devices are produced. In this second embodiment the first piezoelectric-etching step etches the wafer outside the profile outline into, but not completely through the thickness dimension of the wafer. The second piezoelectric-etching step completes the etch through the thickness dimension outside the profile outline and also forms the grooves in the first groove regions. Compared to the first embodiment method, the second embodiment utilizes extra steps to remove all remaining bits of the first photoresist layer and to form a second photoresist layer. However, the second embodiment is efficient if the photoresist is harmed in the first metal-film-etching step and first piezoelectric-etching step. The second embodiment also produces uniformly sized tuning-fork type piezoelectric vibrating devices while preventing peeling of the piezoelectric vibrating devices from the crystal wafer.

Either of the method embodiments summarized above can further comprise forming a new metal film after removing remaining bits of photoresist layer or after the second piezoelectric-etching step, forming a new photoresist layer on the metal film, and performing a third metal-film-etching step to etch the metal film. After removing exposed portions of this photoresist layer, the remaining photoresist defines the pattern of electrodes to be formed on the piezoelectric vibrating devices.

The base can include second groove portions. In certain embodiments, the photoresist layer can be patterned to define the second groove portions. To form the second groove portions, the second metal-film-etching step removes material of the wafer to a predetermined depth in the thickness dimension of the wafer (but not completely through the thickness dimension, to form the second groove regions. The second groove regions in the base of the piezoelectric vibrating device prevent vibration leakage from the vibrating arms. The second piezoelectric-etching step forms the first and second groove regions at the same time and in the same process step.

The piezoelectric vibrating devices desirably include at least a pair of supporting arms, extending from the base, used for supporting the base. The supporting arms can define respective third groove regions. In methods for manufacturing such devices, the second metal-film-etching step desirably also etches portions of the metal film revealed by removing exposed photoresist in the third groove regions. The second piezoelectric-etching step etches away material of the wafer to produce the third groove regions. Thus, even if the base of the piezoelectric vibrating device has third groove regions to prevent vibration leakage from the vibrating arms, the second piezoelectric-etching step can be utilized to form second groove regions and third groove regions at the same time and in the same process step.

In the second piezoelectric-etching step of certain embodiments, the depth at which the first groove regions are etched into the thickness dimension of the wafer is greater than the etching depth in the first piezoelectric-etching step. Thus, the second piezoelectric-etching step can be utilized to etch the first groove regions with appropriate depth while also completing etch through the entire thickness dimension in other regions (such as outside the profile outline).

In various embodiments, the first groove regions are formed on both the front and rear (upper and lower) surfaces of the vibrating arms. Vibrating arms having such configurations allow desired lowering of the CI value of the device.

Any of the various method embodiments can include steps directed to mounting the piezoelectric vibrating device in a package and then sealing the package. The package desirably allows electrical connections (e.g., via leads) from outside the package to the piezoelectric vibrating device inside the package.

The various embodiments allow production of uniformly-sized tuning-fork type piezoelectric vibrating devices using fewer manufacturing steps than conventionally and while preventing premature fracture of individual piezoelectric vibrating devices from the crystal wafer.

Various representative embodiments are described below with reference to the accompanying figures.

BRIEF DESCRIPTION OF THE DRAWINGS

(FIG. 4 is a continuation of FIG. 3.) The figures to the right of the denoted steps show the results of the respective steps.

FIG. 7 is a flow-chart of steps of an embodiment of a process for forming electrodes, adjusting the vibration frequency of the arms excited by the electrodes, and subsequent packaging of vibrating devices meeting specifications.

FIG. 9 is a flow-chart of steps of a known method for manufacturing a tuning-fork type crystal vibrating device.

DESCRIPTION OF THE PREFERRED EMBODIMENTS

General Configuration of Tuning-Fork Type Crystal Vibrating Device

Figure 1A:
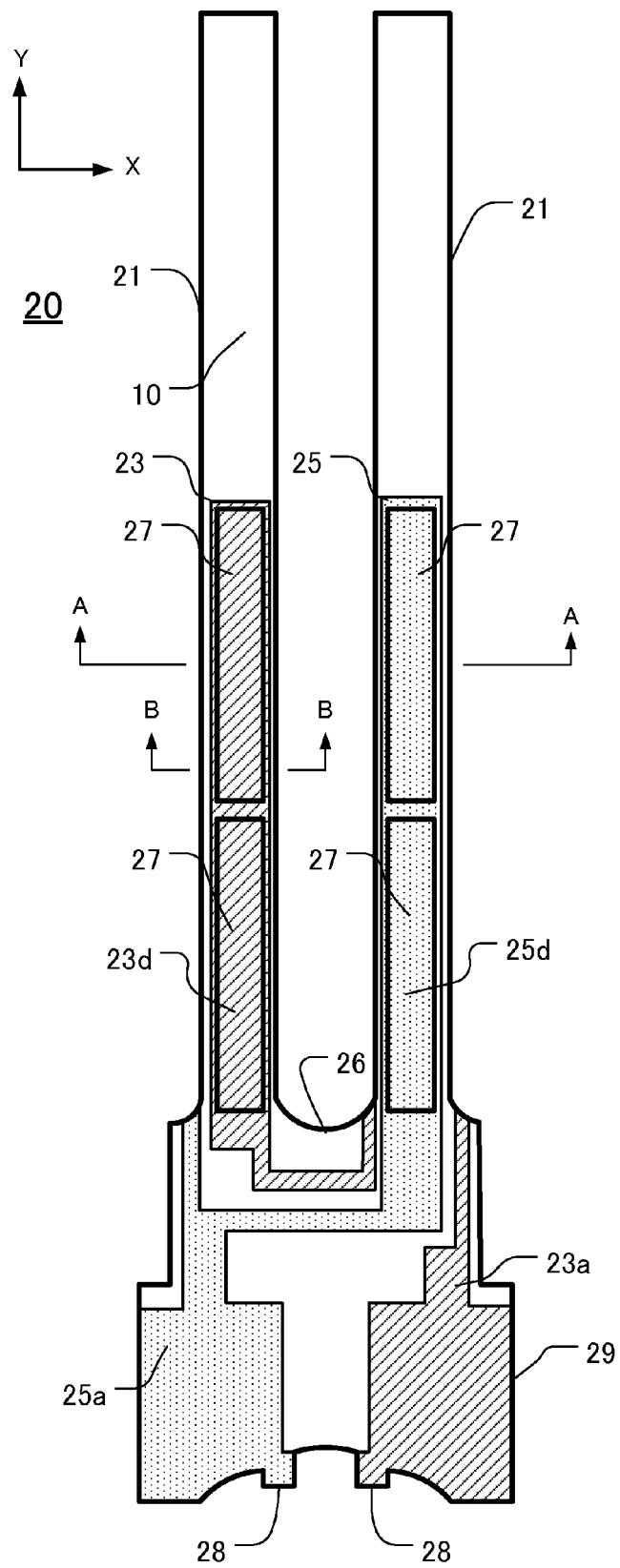
FIG. 1A is a top (plan) view of a tuning-fork type crystal vibrating device.
Figure 1B:
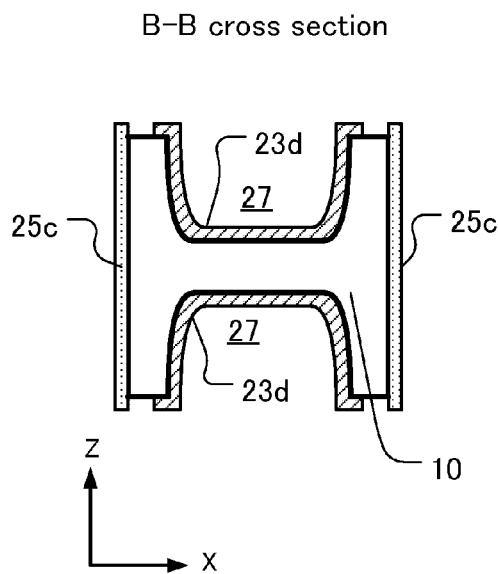
FIG. 1B is a cross-sectional view of an arm of the device of FIG. 1A, along the line denoted B-B.

FIG. 1A is a plan view showing a representative configuration of a tuning-fork type crystal vibrating device 20, and FIG. 1B is an elevational section along the line denoted B-B in FIG. 1A. The section shown in FIG. 1B is across one of the vibrating arms of the device 20. The arms 21 extend from a base 29, and both arms are formed from a single-crystal wafer 10 processed as a Z-cut board. The arms 21 and base 29 are very small but nevertheless are of high quality. In the configuration shown in FIG. 1A, the vibrating arms 21 extend parallel each other from the base in a tuning-fork-like manner such that relatively distal portions of the arms (relative to the base 29) are free to vibrate when excited. The pair of arms 21 includes a crotch portion 26 having a "taper" that reduces changes in or fluctuation of the resonance frequency of the arms that otherwise could be caused by changes in ambient temperature. The taper can be U-shaped (as shown) or V-shaped. The embodiment is described further below in the context of the device 20 having a pair of vibrating arms 21. But it will be understood that the number of arms in a device can be more than two, such as but not limited to, three or four arms.

The tuning-fork type crystal vibration device 20 is normally very small, about 1.7 mm long and 0.5 mm wide, and produces an oscillation frequency of, for example, 32.768 kHz. On the both the upper and lower surfaces of each of the vibrating arms 21, groove regions 27 are defined. In the figure at least one respective groove region 27 is situated on the upper surface of each arm, and at least one respective groove region 27 is situated on the lower surface of each arm 21. Thus, at least two groove regions 27 are formed on the upper surface and at least two are formed on the lower surface of the arms 21. The depth of the groove regions 27 is approximately 35 to 45% of the thickness of the single-crystal wafer 10 so that they do not extend completely through the thickness dimension of the arms 21. As shown in FIG. 1B, the cross-section of the arm has a substantially H-shape as a result of the groove region 27 being formed on both surfaces of the arm. The groove regions 27 lower the CI value. In this embodiment, each arm includes two first groove regions 27, yielding a total of four first groove regions in a device 20 of this embodiment. Alternatively, each arm 21 can have one first groove region 27, yielding a total of two groove regions in the device.

The base 29 of the tuning-fork type crystal vibration device 20 has a substantially board shape. The length of the base 29 relative to the length of the vibrating arms 21 is approximately 36%. At the proximal edge of the base 29, opposite the crotch portion 26, two connecting portions 28 are formed. These connecting regions 28 are formed by photolithography and wet-etching during formation of the tuning-fork shape shown in FIG. 1A. The connecting portions 28 connect the tuning-fork type crystal vibration device 20 to the wafer 10 during processing.

On each arm 21 and on the base 29 are respective first electrodes 23 and second electrodes 25. The first electrode 23 and the second electrode 25 each have a gold (Au) layer of 100 to 5000 Ångstroms thickness formed on a chrome (Cr) layer of 150 to 5000 Ångstroms thickness. Thus, the first and second layers of the electrodes 23, 25 have a combined thickness of 250 to 10,000 Ångstroms. Alternatively to chrome (Cr), the first layer can be made of nickel (Ni) or titanium (Ti). Alternatively to gold (Au), the second layer can be made of silver (Ag). The electrodes 23, 25 alternatively can be made of a single layer of, for example, aluminum (Al), copper (Cu), or silicon (Si).

On the base 29, as shown in FIG. 1A, a first base electrode 23a and a second base electrode 25a are formed. On the first groove region 27 of each arm 21, a first groove electrode 23d and a second groove electrode 25d are formed. Also, as shown in FIG. 1B, on both side surfaces of the left arm are respective second side surface electrodes 25c. (On both side surfaces of the right arm are respective first side surface electrodes 23c, not detailed.)

Exemplary Configurations of Single-Crystal Wafer

Figure 2A:
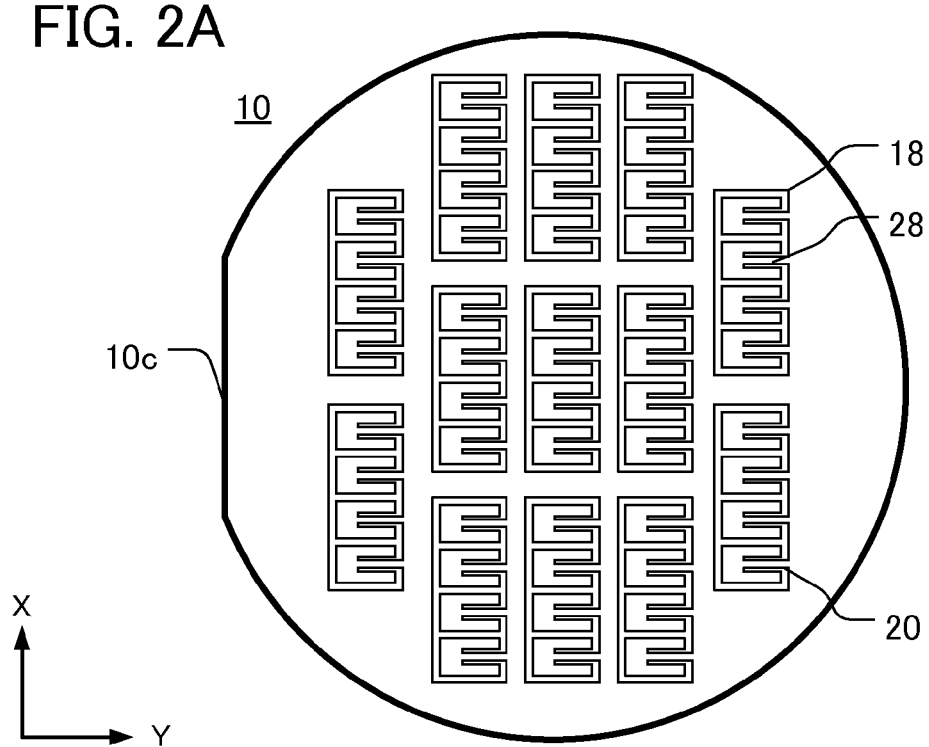
FIG. 2A is a plan view of a circular single-crystal wafer on which have been formed multiple tuning-fork type crystal vibrating devices.
Figure 2B:
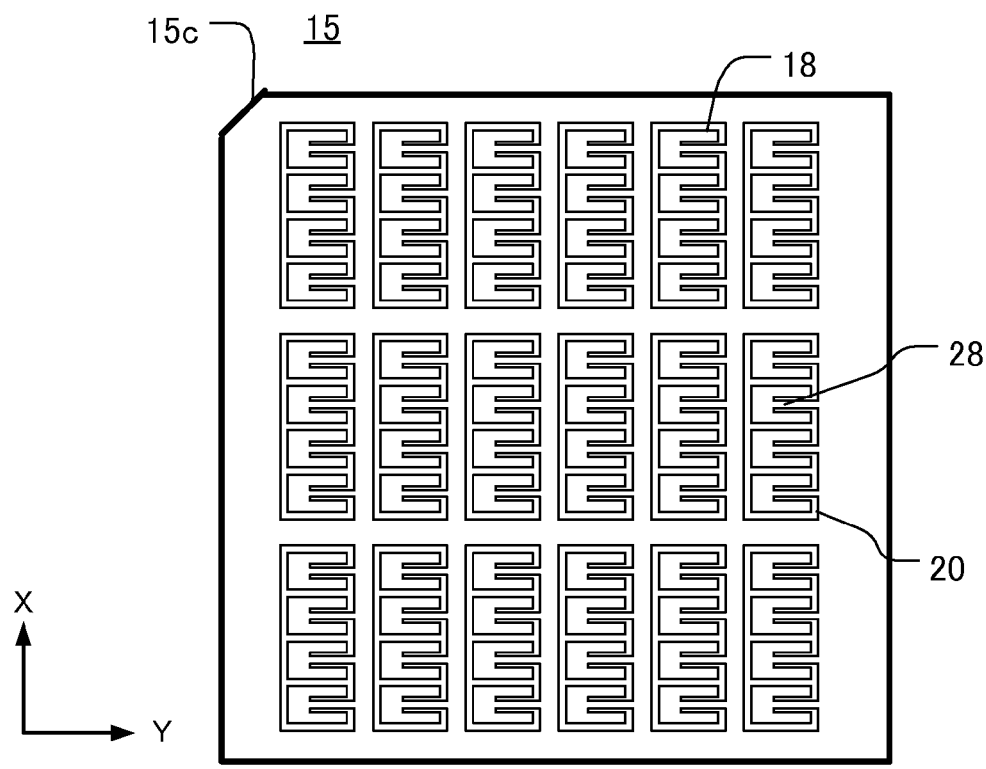
FIG. 2B is a plan view of a rectangular single-crystal wafer on which have been formed multiple tuning-fork type crystal vibrating devices.

FIGS. 2A and 2B are plan views of respective single-crystal wafers on which profile outlines of multiple tuning-fork type crystal vibrating devices have been formed. These are views of the wafer surface after completion of the wet-etching step S115 of FIG. 3. The wafer in FIG. 2A is circular, comprising a synthetic crystal having a thickness of 0.4 mm and a wafer diameter of three or four inches. Serving as a reference for an axial direction, the circular wafer 10 includes an orientation flat 10c defining a crystal-lattice orientation direction of the crystalline material. The flat 10c is formed on a part of the periphery of the wafer 10.

The wafer 15 shown in FIG. 2B is rectangular in shape, comprising a synthetic crystal having a thickness of 0.4 mm and a side length of two inches. Serving as a reference for an axial direction, the rectangular wafer 15 includes an orientation flat 15c defining a crystal-lattice orientation direction of the crystalline material.

On each of the wafers 10, 15, because of the relationship between process management and wafer strength, multiple windows 18 are formed, and several tuning-fork type crystal vibrating devices 20 are formed on each window. In each window 18, connecting portions 28 connect the respective vibrating devices 20 to the wafer 10, 15.

First Embodiment of Method for Manufacturing Tuning-Fork Type Crystal Vibrating Devices In this embodiment, by simultaneously etching the profile outlines and the first groove regions 27, the etching (and overall processing) time is reduced compared to conventional processes. Also, shape variations in manufacturing lots of devices are reduced.

Figure 3:
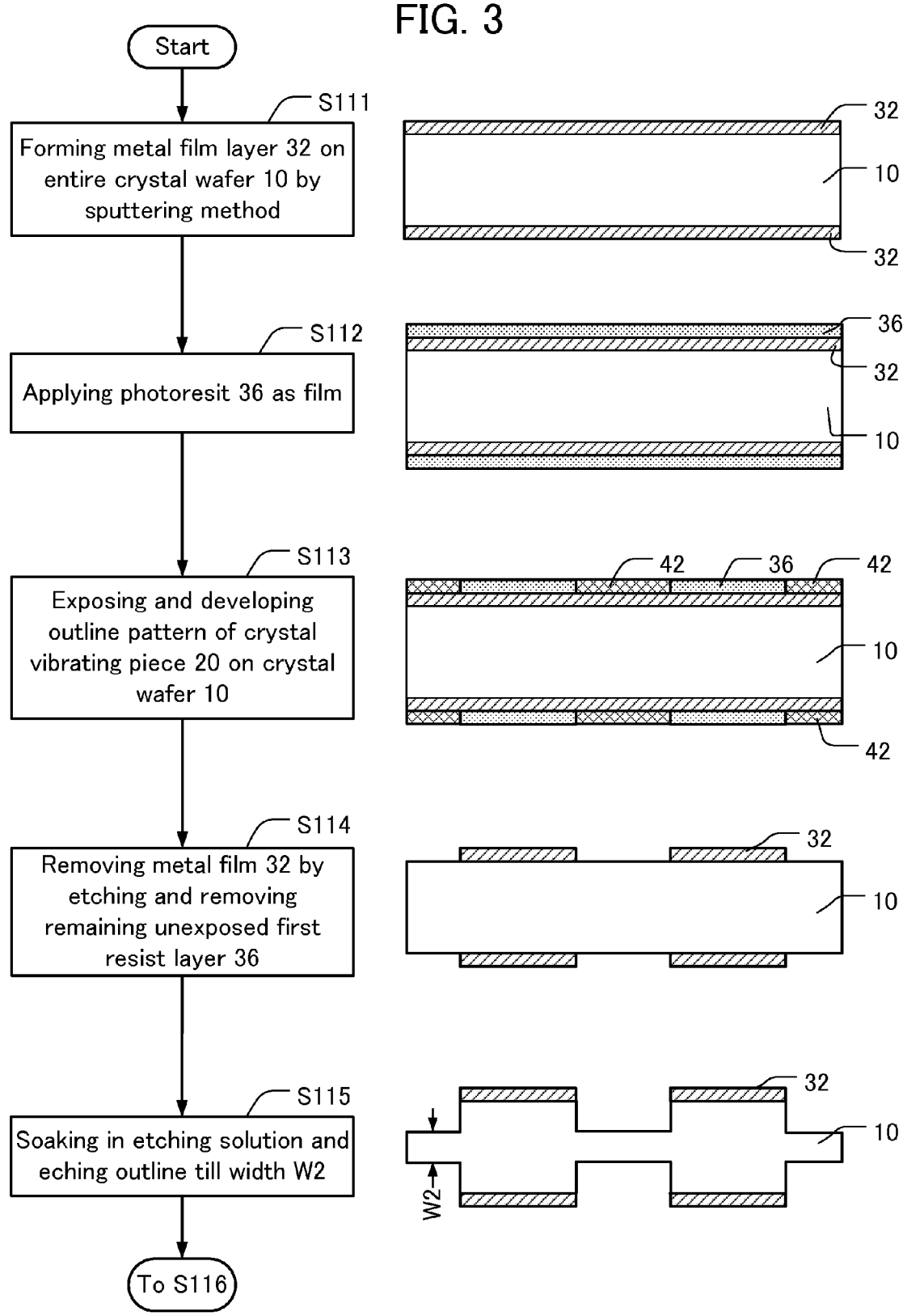
FIG. 3 is a flow-chart of a first series of steps of a first embodiment of a process for forming the profile outline of the tuning-fork type crystal vibrating device 20 as well as first groove regions 27 on the arms thereof. The figures to the right of the denoted steps show the results of the respective steps, along the line A-A in FIG. 1A.
Figure 4:
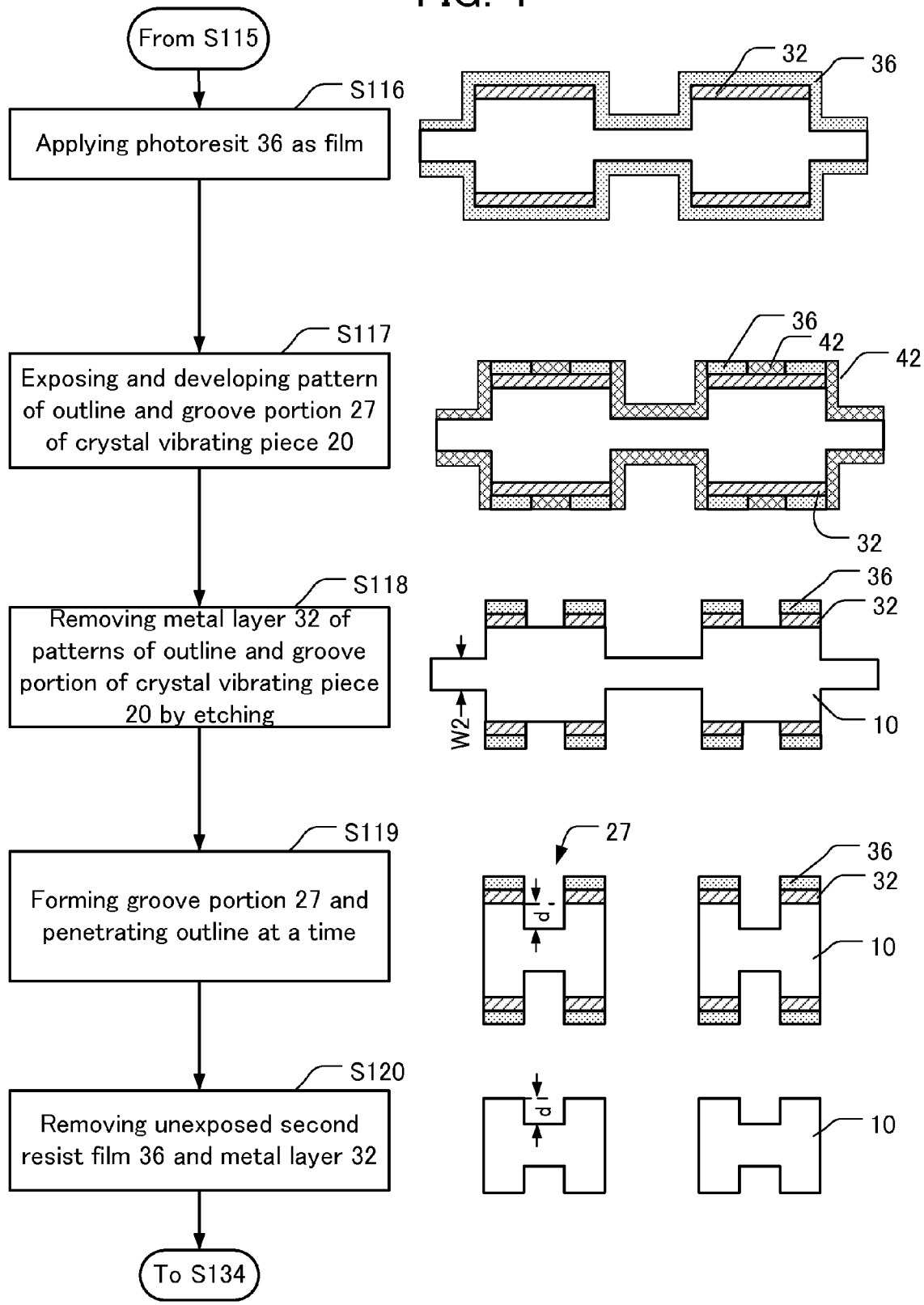
FIG. 4 is a flow-chart of a second series of steps of the first embodiment of a process for forming the profile outline of the tuning-fork type crystal vibrating device 20 as well as first groove regions 27.

FIGS. 3 and 4 are respective flow-charts of a method for forming the profile outline and the first groove regions 27 of the tuning-fork type crystal vibrating devices 20. The respective figures to the right of the flow-chart steps are elevational sections, along the line A-A in FIG. 1A, depicting the result of the step.

In step S111 a single-crystal wafer 10 is prepared. Then, a metal film 32 is formed, by sputtering or other suitable deposition technique, on the entire surface (both sides) of the wafer 10. It is difficult to form gold (Au) or silver (Ag) directly on a piezoelectric wafer, so a chrome (Cr), nickel (Ni), or titanium (Ti) layer is applied first for use as a base coat for the gold or silver layer. By way of example, in this embodiment, the metal film 32 comprises a base-coat layer of chrome and an overlying gold layer. Also by way of example, the thickness of the chrome layer is 500 Ångstroms and the thickness of the gold layer is 1000 Ångstroms. FIG. 3A shows the single-crystal wafer 10 upon completion of this step.

In step S112 a first photoresist layer 36 is applied evenly by spin-coating on the entire surface (both sides) of the wafer 10 on which the metal film 32 has been formed. An exemplary photoresist in the first photoresist layer 36 is a positive photoresist containing novolak resin. The wafer 10 upon completion of this step is shown on the right of step S112.

Next, in step S113 an exposure apparatus is used to produce images of the profile outlines of the tuning-fork type crystal vibrating devices 20 in the first photoresist layer 36. The first photoresist layer 36 is then developed, and exposed photoresist 42 is removed. The result of this step is shown to the right of step S113.

In step S114 portions of the gold layer revealed by removal of exposed regions of the first photoresist layer 36 are etched using an aqueous solution of iodine and potassium iodide. Then, portions of the underlying chrome layer revealed by removal of respective portions of the gold layer are etched using, for example, an aqueous solution of ceric ammonium nitrate and acetic acid. The concentrations of etching solutes, temperature, and etching time are controlled to avoid over-etch. Thus, revealed portions of the metal film 32 are removed. This step is termed a "first metal-film-etching step." Then, remaining unexposed regions of the first photoresist layer 36 are stripped. The result of this step is shown to the right of step S114.

In step S115 portions of the single-crystal wafer 10 revealed by removal of regions of the metal film 32 are wet-etched to form the profile outlines of the tuning-fork type crystal vibrating devices 20. The etching conditions are controlled to retain the thickness W2 and to avoid progression of etching through the entire thickness of the wafer 10, as shown in the figure to the right of step 115. If the etched depth of the first groove regions 27 is "d", as shown in the figure to the right of step 120, the thickness W2 is controlled such that W2≦d. This step is denoted as a "first piezoelectric-etching step."

Turning now to FIG. 4, which is a continuation of FIG. 3, in step S116 a new (second) layer of photoresist 36 is applied by spin-coating or spraying on both surfaces of the wafer. The result of this step is shown to the right of step S116.

In step S117 an exposure apparatus is used to expose the profile outlines of the tuning-fork type crystal vibrating devices 20 and of the first groove regions 27 into the second layer of photoresist 36. Exposures are made on both sides of the wafer. The exposed photoresist 42 is developed and exposed regions thereof are removed. The result of this step is shown to the right of step S117.

In step S118 the metal film 32 in the first groove regions 27 is removed by etching, using the same technique used in step S114 of FIG. 3. The result of this step is shown to the right of step S118. This step is denoted a "second metal-film-etching step."

In step S119 wet-etching of the crystal material in the first groove regions 27 and outside the profile outlines is performed simultaneously, using a fluorinated acid solution. The etch solution etches portions of the crystal that have been revealed after removing corresponding regions of the exposed photoresist 42 and of the metal film 32. Etching is stopped after a predetermined time, at which time etching has progressed entirely through the thickness dimension of the wafer outside the profile outlines. Control of etching depth in this way is possible because W2<d (see figures to the right of steps 118 and 119). By avoiding over-etch of the first groove regions 27 due to W2<d, the sectional profile of the tuning-fork type crystal vibrating device 20 is precisely vertical, which reduces dimensional variations in the lots of tuning-fork type crystal vibrating devices 20 produced from the wafer. The step is denoted as a "second piezoelectric-etching step."

In step S120, the remaining unexposed regions of the photoresist layer 36 and metal film 32 are removed to produce the vibrating devices 20 each including first groove regions 27 depicted in the figure to the right of step S120.

Figure 5:
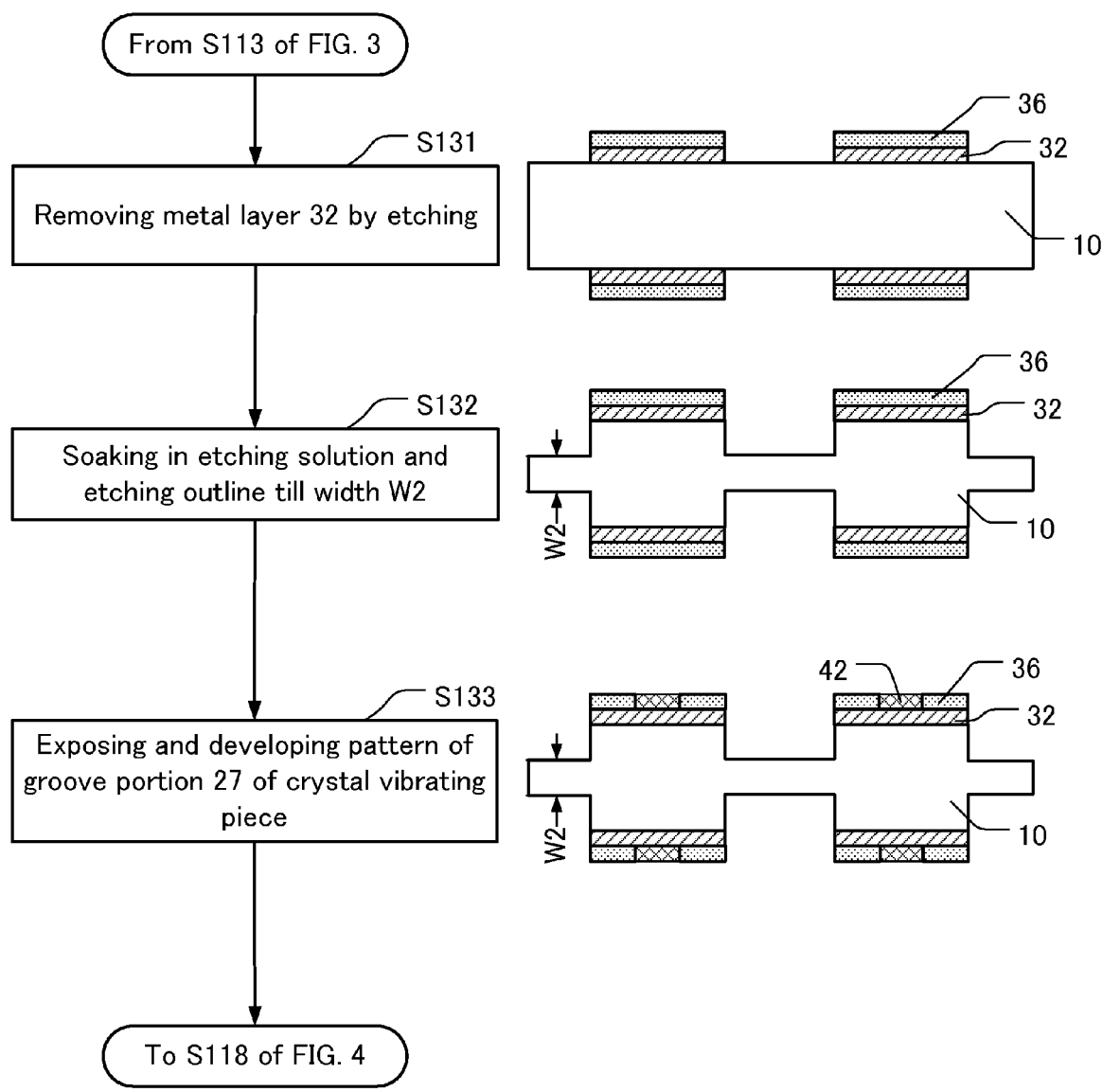
FIG. 5 is a flow-chart of steps of a second embodiment of a process, having fewer steps than the first embodiment, for forming the profile outline of the tuning-fork type crystal vibrating device 20 as well as first groove regions 27. The figures to the right of the denoted steps show the results of the respective steps.

Second Embodiment of Method for Manufacturing Tuning-Fork Type Crystal Vibrating Devices The process of this embodiment has fewer steps than the process of the first embodiment, allowing the tuning-fork type piezoelectric vibrating devices 20 to be formed in less time than achievable with the first embodiment. Key steps of this embodiment are shown in the flow-chart of FIG. 5. As in the figures corresponding to the first embodiment, figures on the right of each step in FIG. 5 are elevational sections along the line A-A shown in FIG. 1A.

Steps S111 to S113 in this embodiment are the same as corresponding steps S111-S113 in the first embodiment. The exposed photoresist 42 is developed, and the exposed photoresist 42 is removed. In step S131 of FIG. 5, revealed portions of the metal film 32 are etched away while remaining regions of the unexposed photoresist layer 36 protect other portions of the metal film 32. The result of this step is shown in the figure to the right of step S131.

In step S132, as in the first embodiment, regions of the single-crystal wafer 10 revealed by etching of the metal film 32 are wet-etched to form profile outlines of the tuning-fork type crystal vibrating devices 20. In this wet-etching step, as in the first piezoelectric-etching step, the thickness W2 is retained to avoid etching through the entire thickness of the wafer 10. Etching is controlled such that W2≦d. The result of this step is shown to the right of step S132.

In step S133 the first groove regions 27 are exposed on the remaining unexposed photoresist layer 36 from step S131. The photoresist is developed, and the exposed photoresist 42 is removed. The process then advances to step S118 of FIG. 4, so that the second metal-film-etching step and the second piezoelectric-etching step can be performed as in the first embodiment. Thus, tuning-fork type piezoelectric vibrating devices 20 including first groove regions 27 are formed on the single-crystal wafer 10.

In the first and second embodiments, etching time is reduced compared to conventional methods. Etching time is further reduced in the second embodiment compared to the first embodiment, which allows corresponding increases in production capacity. Also, simultaneous formation of the profile outlines and the first groove regions 27 of the tuning-fork type crystal vibrating devices 20 enables production of high-quality devices 20 because the result of localized variations in the etching solution contacting the single-crystal wafer 10 are correspondingly reduced. Also, extending the profile outlines through the wafer later in the process allows the connecting portions 28 to be formed later in the process, thereby lowering the probability of process damage to the devices 20 still attached to the wafer.

Third Embodiment of Method for Manufacturing Tuning-Fork Type Crystal Vibrating Devices Current demand is for very small tuning-fork type crystal vibrating devices. As these devices are configured with increasingly complex shapes, they are more likely to be damaged during manufacture. However, their precision is increased. By employing the manufacturing processes of the first and second embodiments, smaller tuning-fork type crystal vibrating devices can be formed more precisely and with less collateral damage.

Figure 6A:
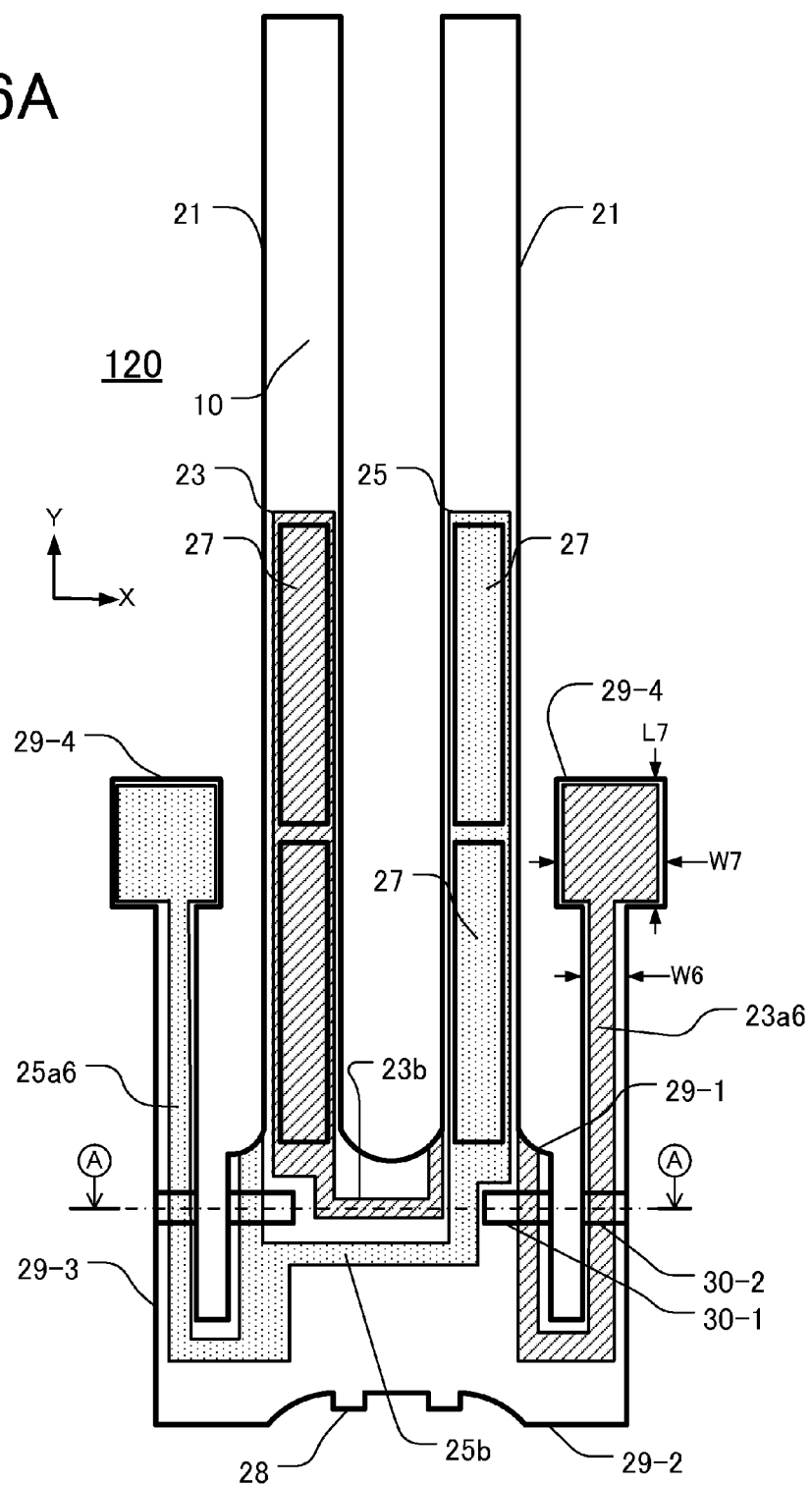
FIG. 6A is a plan view of a more complex tuning-fork type crystal vibrating device than shown in FIG. 1A.

FIG. 6A shows, by way of example, a tuning-fork type crystal vibrating device 120 having small size and a complex shape. (Certain reference numbers in FIG. 6A are the same as corresponding reference numbers used in FIG. 1A for similar elements.) The crystal vibrating device 120 can be formed with a smaller base 29 than the base on the device 20, and the length of the device 120 in the Y-direction can be shorter than the length of the device 20.

The crystal vibrating device 120 is wider in the X-direction at the base 29 in the middle of two parts of the connecting portion 28 where the vibrating arms 21 are formed. The device 120 has supporting arms 29-3 situated outboard of the arms 21 and extending parallel to the arms 21. The width W6 of the supporting arms 29-3 is relatively narrow, ranging from 0.05 mm to 0.08 mm. The supporting arms 29-3 terminate with respective broader portions 29-4 having width W7 in the range 0.14 mm to 0.20 mm and length L7 in the range 0.14 mm to 0.20 mm.

Figure 6B:
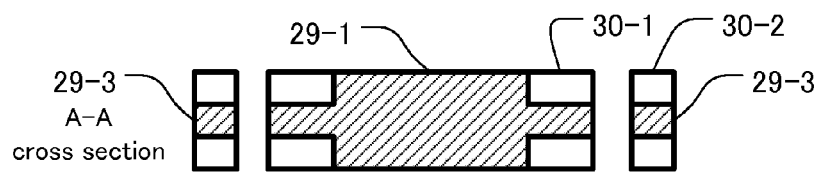
FIG. 6B is an elevational section along the line A-A in FIG. 6A.

FIG. 6B is an elevational section along the line A-A in FIG. 6A. FIG. 6B depicts second groove regions 30-1 and third groove regions 30-2, which serve to reduce vibration leakage of the tuning-fork type crystal vibrating device. The depth of the second groove regions 30-1 and of the third groove regions 30-2 can be the same as of the first groove regions 27. This allows formation of the second groove regions 30-1 of the base 29 and of the third groove regions 30-2 of the supporting arms 29-3 simultaneously with formation of the first groove regions 27 in step S119 of FIG. 4.

Electrode Formation, Frequency-Adjustment, and Packaging

The tuning-fork type crystal vibrating devices 20 and 120 formed in any of the first, second, and third embodiments are now subject to a process for forming electrodes, adjusting the vibration frequency, and packaging. FIG. 7 is a flow-chart of the steps of an exemplary process as performed on the device 20.

In step S141 the tuning-fork type crystal vibrating device 20 is cleaned with purified water. A metal film 32 is formed on the device by sputtering or spraying to form excitation electrodes used for exciting vibration of the arms. The metal film 32 is formed on the entire surface (both sides) of the vibrating device 20.

In step S142, photoresist is applied by spraying on the entire surface (both sides) of the device. As a result of the first groove regions 27 being present on the device 20, the photoresist is also applied in the first groove regions 27.

In step S143, a photo-mask corresponding to an electrode pattern is prepared. Using the photo-mask, the electrode pattern is exposed in the photoresist on both surfaces of the device 20.

In step S144, the photoresist layers are developed, and the exposed photoresist is removed. The remaining photoresist defines the electrode pattern. The metal film 32 is etched. I.e., portions of the gold layer revealed by removal of the exposed photoresist corresponding to the electrode pattern are etched by, for example, a solution of iodine and potassium iodide. Then the revealed portions of the underlying chrome layer are etched by a solution of cerium-diammonium nitrate and acetic acid.

In step S145 the remaining photoresist is stripped. Upon completion of this step, the driving electrodes and other electrodes are formed with accurate position and dimensions on the vibrating devices 20. In other words, devices 20 having the desired electrodes 23, 25 and first groove portions 27 are obtained.

Figure 8A:
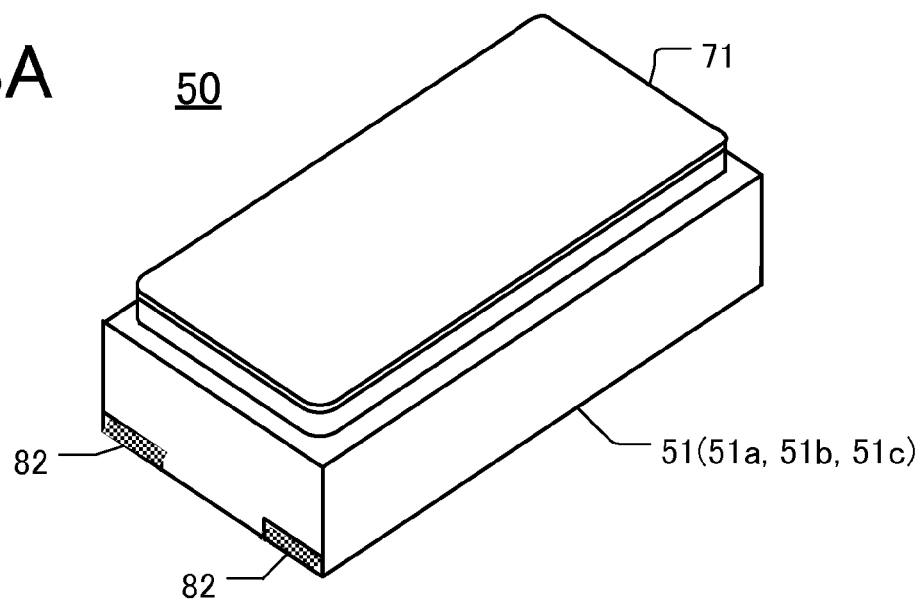
FIG. 8A is a perspective view of an embodiment of a crystal oscillator 50 comprising a vibrating device enclosed in a ceramic package.
Figure 8B:
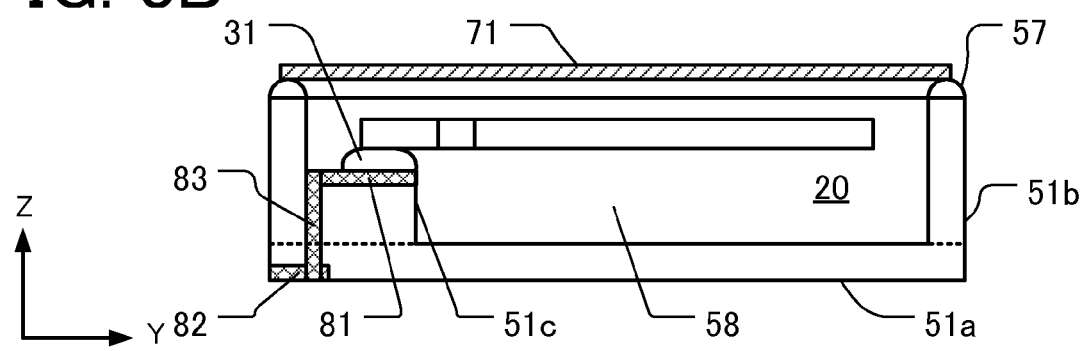
FIG. 8B is an elevational section of the device shown in FIG. 8A.

In step S146, the tuning-fork type crystal vibrating device 20 is bonded to a ceramic package 51, as shown in FIG. 8B, using electrically conductive adhesive 31. More specifically, the base 29 of the tuning-fork type crystal vibrating device 20 is mounted on electrically conductive adhesive 31 applied to the wiring layer 81, and the electrically conductive adhesive 31 is hardened partially. Hardening is completed in a hardening furnace to complete attachment of the tuning-fork type crystal vibrating device 20 to the terminal electrodes 82 of the package 51.

In step S147 further a laser light is irradiated as required onto the surfaces of the vibrating arms 21 of the devices 20 to evaporate selected portions of weight metal layers on the vibrating arms 21. The laser light evaporates and sublimes the irradiated weight material, which changes the mass of the arms 21 and produces corresponding increases in the vibration frequency of the arms.

In step S148 the package 51 containing the tuning-fork type piezoelectric vibrating device 20 shown in FIG. 8B is placed in a vacuum chamber, in which the cap 71 is adhered using a sealing material 57.

In step S149 the performance of the piezoelectric vibrating device 50 is tested against specifications, thereby completing fabrication of the device 50.

Crystal Resonator Comprising Piezoelectric Vibrating Device

Figure 8C:
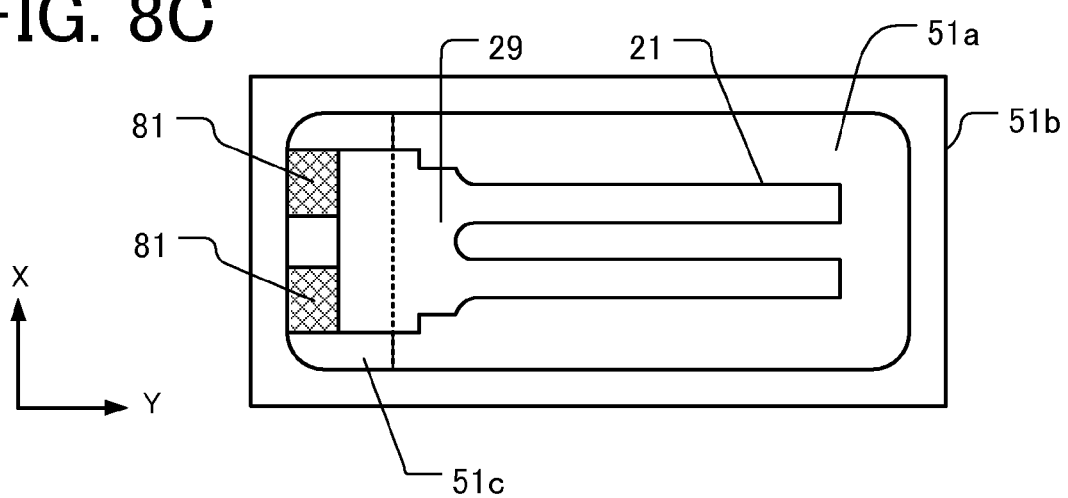
FIG. 8C is a plan view of the device of FIG. 8A with the metal cap 71 removed.

An embodiment of a crystal resonator 50 is described with reference to FIGS. 8A-8C, in which FIG. 8A is a schematic view of the crystal resonator 50, FIG. 8B is an elevational section, and FIG. 8C is a top (plan) view (with metal lid 71 removed to show underlying detail).

The crystal resonator 50 comprises an insulating ceramic package 51 and a metal lid 71. The metal lid 71 desirably is made of Kovar (Fe/Ni/Co). The ceramic package 51 comprises a first ceramic layer for forming the bottom 51a, a second ceramic layer for forming walls 51b, and a third ceramic layer for forming the base 51c of the package. These layers are press-cut from ceramic "green sheet" made of ceramic alumina-based ceramic powder or ceramic slurry including a binder. Representative alternative materials for forming the ceramic package 51 include glass ceramic or non-shrink glass-ceramic base board instead of alumina-based ceramic powder. As understood from FIG. 8B, the package comprises multiple ceramic layers 51a, 51b, 51c that form a cavity 58. The tuning-fork type crystal vibrating device 20 is mounted within the cavity 58.

The wiring pattern of the base portion 29 includes a conductive area that electrically contacts electrically conductive adhesive 31 used for mounting the device 20 inside the cavity 58. Specifically, the device 20 is bonded to the ceramic base 51c using the adhesive 31, allowing the arms 21 to extend horizontally in a cantilever manner so that they are free to generate a predetermined vibration. The top of the ceramic layer forming the base 51c includes a wiring layer 81 providing electrical contact with the region of the device 20 that is bonded using the adhesive 31. At least two terminal electrodes 82, formed at the bottom of the ceramic package 51, serve as external terminals when the package is surface-mounted on a printed substrate (circuit board, not shown). Internal wiring 83 electrically connects the wiring layer 81 with respective terminal electrodes 82.

For attachment of the lid 71, a metallization layer is formed on the upper edge of the ceramic layer for the wall 51b. A sealing material 57 made of low-temperature brazing filler metal is formed on the upper edge. The lid 71 is bonded to the ceramic layer for the wall 51b using the sealing material 57.

Various representative embodiments are described above. However, it will be understood by persons of ordinary skill in the art that any of the foregoing embodiments can be modified or changed while remaining within the scope of the invention. For example, in the tuning-fork type piezoelectric vibrating device, the crystal material can be a piezoelectric single-crystal material such as lithium niobate, as an alternative to synthetic crystal.

Certain descriptions above are set forth in the context of a single-crystal wafer 10, as shown in FIG. 3. Alternatively, a connecting wafer comprising two connected wafers can be used. A bonded crystal wafer used for gyros comprises a first crystal wafer and a second crystal wafer that are cut in the Z-axis direction. The first bonded crystal wafer and the second bonded crystal wafer are bonded together by direct bonding, specifically by use of heat-resistant siloxane bonding. Siloxane bonding is conducted by a process including cleaning the single-crystal surfaces of both the first and second crystal wafers, bonding the cleaned surfaces, and annealing at about 500 C to achieve single crystallization. The present invention can be applied to such a bonded crystal wafer.

What is claimed is:

1. A method for manufacturing a piezoelectric vibrating device having a base and at least a pair of vibrating arms extending from the base, the vibrating arms defining a first groove regions, the method comprising:

forming a metal film on both surfaces of a piezoelectric wafer, the wafer having a thickness;

on the metal film, forming a layer of photoresist and exposing the photoresist to pattern the layer of photoresist, the pattern including a profile outline of the piezoelectric vibrating device;

performing a first metal-film-etching step to etch the metal film according to the pattern in the layer of photoresist, including etching outside the profile outline;

performing a first piezoelectric-etching step to etch the wafer outside the profile outline but not completely through the thickness of the wafer;

after the first piezoelectric-etching step, exposing the photoresist to pattern the layer of photoresist, the pattern including the profile outline and first groove regions to be formed in the arms;

performing a second metal-film-etching step to etch the metal film according to the pattern in the layer of photoresist; and performing a second piezoelectric-etching step to etch the wafer outside the profile outline and in the first groove regions, the etching outside the profile outline being completely through remaining thickness of the wafer, and the etching in the first groove regions being partly through the thickness, thereby forming the piezoelectric vibrating device.

2. The method of claim 1, wherein, in the second piezoelectric-etching step, the first groove regions are formed to a depth, in the thickness of the wafer, greater than an etching depth in a region of the wafer subjected to the first piezoelectric-etching step.

3. The method of claim 1, wherein, in the second piezoelectric-etching step, the first groove regions formed on both front and back surfaces of each of the vibrating arms.

4. The method of claim 1, further comprising:

after the second piezoelectric-etching step, removing the remaining photoresist and forming a new metal film;

forming an additional layer of photoresist and exposing the resist to pattern the additional layer of photoresist, the pattern including an electrode pattern; and conducting a third metal-film-etching step to etch the metal film according to the pattern in the additional layer of photoresist to form at least one electrode.

5. The method of claim 1, wherein:

the base defines second groove regions;

the step of forming and exposing the layer of photoresist comprises patterning the layer of photoresist to include the second groove regions;

the second metal-film-etching step comprises removal of the metal film in the second groove regions; and the second piezoelectric-etching step etches the second groove portions.

6. The method of claim 5, wherein:

the piezoelectric vibrating device comprises at least two supporting arms extending from the base to support the base;

the supporting arms define third groove portions;

the step of forming and exposing the layer of photoresist comprises patterning the layer of photoresist to include the third groove regions;

the second metal-film-etching step comprises removal of the metal film in the third groove regions; and the second piezoelectric-etching step etches the third groove portions.

7. The method of claim 1, wherein:

the piezoelectric vibrating device comprises at least two supporting arms extending from the base to support the base;

the supporting arms define third groove portions;

the step of forming and exposing the layer of photoresist comprises patterning the layer of photoresist to include the third groove regions;

the second metal-film-etching step comprises removal of the metal film in the third groove regions; and the second piezoelectric-etching step etches the third groove portions.

8. A method for manufacturing a piezoelectric vibrating device having a base and at least a pair of vibrating arms extending from the base, the vibrating arms defining a first groove regions, the method comprising:

forming a metal film on both surfaces of a piezoelectric wafer, the wafer having a thickness;

on the metal film, forming a layer of photoresist and exposing the photoresist to pattern the layer of photoresist, the pattern including a profile outline of the piezoelectric vibrating device;

performing a first metal-film-etching step to etch the metal film according to the pattern in the layer of photoresist, including etching outside the profile outline;

performing a first piezoelectric-etching step to etch the wafer outside the profile outline but not completely through the thickness of the wafer;

after the first piezoelectric-etching step, without forming an additional layer of photoresist, exposing the photoresist to pattern the layer of photoresist, the pattern including the profile outline and first groove regions to be formed in the arms;

performing a second metal-film-etching step to etch the metal film according to the pattern in the layer of photoresist; and performing a second piezoelectric-etching step to etch the wafer outside the profile outline and in the first groove regions, the etching outside the profile outline being completely through remaining thickness of the wafer, and the etching in the first groove regions being partly through the thickness, thereby forming the piezoelectric vibrating device.

9. The method of claim 8, wherein:

the base defines second groove regions;

the step of forming and exposing the layer of photoresist comprises patterning the layer of photoresist to include the second groove regions;

the second metal-film-etching step comprises removal of the metal film in the second groove regions; and the second piezoelectric-etching step etches the second groove portions.

10. The method of claim 9, wherein:

the piezoelectric vibrating device comprises at least two supporting arms extending from the base to support the base;

the supporting arms define third groove portions;

the step of forming and exposing the layer of photoresist comprises patterning the layer of photoresist to include the third groove regions;

the second metal-film-etching step comprises removal of the metal film in the third groove regions; and the second piezoelectric-etching step etches the third groove portions.

11. The method of claim 8, wherein, in the second piezoelectric-etching step, the first groove regions are formed to a depth, in the thickness of the wafer, greater than an etching depth in a region of the wafer subjected to the first piezoelectric-etching step.

* * * * *

UNITED STATES PATENT AND TRADEMARK OFFICE
CERTIFICATE OF CORRECTION

Page 1 of 2

PATENT NO. : 8,365,371 B2
APPLICATION NO. : 12/203035
DATED : February 5, 2013
INVENTOR(S) : Yoshiaki Amano It is certified that error appears in the above-identified patent and that said Letters Patent is hereby corrected as shown below:

In the Drawings:

FIG. 3, S112, "photoresit" should read --photoresist--.

FIG. 3, S115, "eching" should read --etching--.

FIG. 4, S116, "photoresit" should read --photoresist--.

FIG. 7, S147, "Adusting" should read --Adjusting--.

FIG. 9, S114, "resit" should read --resist--.

FIG. 9, S115, "cyrstal" should read --crystal--.

In the Specification:

Column 2, line 6, "step S112)." should read --step S112.)--.

Column 2, line 60, "27 increases" should read --27, increases--.

Column 3, lines 61-62, "through remaining" should read --through the remaining--.

Column 3, line 67, "through the" should read --through, the--.

Column 4, lines 27-28, "dimension, to form" should read --dimension) to form--.

Column 6, line 16, "On the both the" should read --On both the--.

Column 8, line 14, "step 115." should read --step S115.--.

Column 8, line 15, "step 120," should read --step S120,--.

Column 8, line 17, "W2≦d." should read --W2≤d.--.

Column 8, line 45, "steps 118 and 119)." should read --steps S118 and S119).--.

Column 9, line 16, "W2≦d." should read --W2≤d.--.

Column 10, line 38, "etched. I.e.," should read --etched, i.e.,--.

Column 12, line 2, "500 C" should read --500° C--.

Signed and Sealed this
Twenty-ninth Day of March, 2016

Michelle K. Lee
*Director of the United States Patent and Trademark Office*

CERTIFICATE OF CORRECTION (continued)
U.S. Pat. No. 8,365,371 B2

<u>In the Claims:</u>

Column 12, line 8, "defining a first" should read --defining first--.

Column 12, line 67, "supporting aims define" should read --supporting arms define--.

Column 13, line 21, "defining a first" should read --defining first--.